United States Patent
Nový

(10) Patent No.: US 8,279,096 B2
(45) Date of Patent: Oct. 2, 2012

(54) PARALLEL COMPRESSION FOR DICTIONARY-BASED SEQUENTIAL CODERS

(75) Inventor: Jindřich Nový, Brno (CZ)

(73) Assignee: Red Hat, Inc., Raleigh, NC (US)

( * ) Notice: Subject to any disclaimer, the term of this patent is extended or adjusted under 35 U.S.C. 154(b) by 147 days.

(21) Appl. No.: 12/782,892

(22) Filed: May 19, 2010

(65) Prior Publication Data

US 2011/0285556 A1    Nov. 24, 2011

(51) Int. Cl.
*H03M 7/00* (2006.01)
(52) U.S. Cl. ................................ 341/107; 341/106
(58) Field of Classification Search ............. 341/51, 341/87, 106, 107
See application file for complete search history.

(56) References Cited

U.S. PATENT DOCUMENTS

| | | | | |
|---|---|---|---|---|
| 5,729,228 | A * | 3/1998 | Franaszek et al. | 341/106 |
| 7,180,433 | B1 * | 2/2007 | Grotmol | 341/51 |
| 7,616,137 | B2 * | 11/2009 | Fuin | 341/106 |
| 7,668,162 | B1 * | 2/2010 | Albo | 370/389 |

OTHER PUBLICATIONS

Definition of "Dictionary coder", Wikipedia. <http://en.wikipedia.org/wiki/Dictionary_coder>, Date of access: May 18, 2010, 3 pp.
Definition of "Lempel-Ziv-Markov chain algorithm", Wikipedia. <http://en.wikipedia.org/wiki/Lzma>, Date of access: May 18, 2010, 4 pp.
Definition of "LZ77 and LZ78", Wikipedia. <http://en.wikipedia.org/wiki/LZ77>, Date of access: May 18, 2010., 3 pp.
Definition of "Parallel computing", Wikipedia. <http://en.wikipedia.org/wiki/Parallel_computing>, Date of access: May 18, 2010, 19 pp.
Definition of "XZ", Wikipedia. <http://en.wikipedia.org/wiki/Xz>, Date of access: May 18, 2010, 2 pp.
TUKAANI.ORG, "XZ Utils", <http://tukaani.org/xz/>, Date of access: May 18, 2010, 2 pp.

* cited by examiner

*Primary Examiner* — Brian Young
(74) *Attorney, Agent, or Firm* — Lowenstein Sandler PC (57) ABSTRACT

Dictionary-based sequential compression is performed in parallel on input data using multiple cores of a computer system. The compression can be performed by first determining a dictionary size for data compression, followed by determining a block size for partitioning the input data. The block size is greater than the dictionary size. The multiple cores of the computer system then execute multiple threads in parallel, with each thread compressing one block of the input data according to a dictionary-based sequential compression scheme.

19 Claims, 6 Drawing Sheets

PARALLEL COMPRESSION FOR DICTIONARY-BASED SEQUENTIAL CODERS

TECHNICAL FIELD

Embodiments of the present invention relate to data compression, and more specifically, to parallel compression on a multi-processor computer system.

BACKGROUND

Data compression is the process of encoding information using fewer bits than the unencoded information. One of the best performing compression schemes, in terms of archive size and decompression speed, is a dictionary-based sequential coder that uses a compression algorithm such as Lempel-Ziv 77 (LZ77), Lempel-Ziv 78 (LZ78), Lempel-Ziv-Markov chain algorithm (LZMA), or a variant of these algorithms.

A dictionary-based sequential coder (also known as a "dictionary coder" or a "substitution coder") implements a class of lossless data compression algorithms which operate by searching for matches between the text to be compressed and a set of strings contained in a data structure (also known as the "dictionary"). The dictionary is maintained by the encoder. When the encoder finds a match, it replaces the text with a reference to the string's position in the dictionary to gain compression.

Dictionary-based sequential coders, particularly LZMA, typically have a very slow compression speed. Conventionally, sequential coders (including dictionary-based sequential coders) process an input byte-by-byte (that is, sequentially). Sequential processing inherent in the sequential coders prevents parallelization of data compression. Therefore, dictionary-based sequential coders are typically slower than some other coders (e.g., block sorting coders), which are easier to parallelize.

BRIEF DESCRIPTION OF THE DRAWINGS

The present invention is illustrated by way of example, and not by way of limitation, and can be more fully understood with reference to the following detailed description when considered in connection with the figures in which.

DETAILED DESCRIPTION

Described herein is a method and system for parallel data compression. In one embodiment, dictionary-based sequential compression is performed in parallel on input data using multiple cores of a computer system. The compression can be performed by first determining a dictionary size for data compression, followed by determining a block size for partitioning the input data. The block size is greater than the dictionary size. The multiple cores of the computer system then execute multiple threads in parallel, with each thread compressing one block of the input data according to a dictionary-based sequential compression scheme. Compression speed can be significantly improved.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Figure 1:
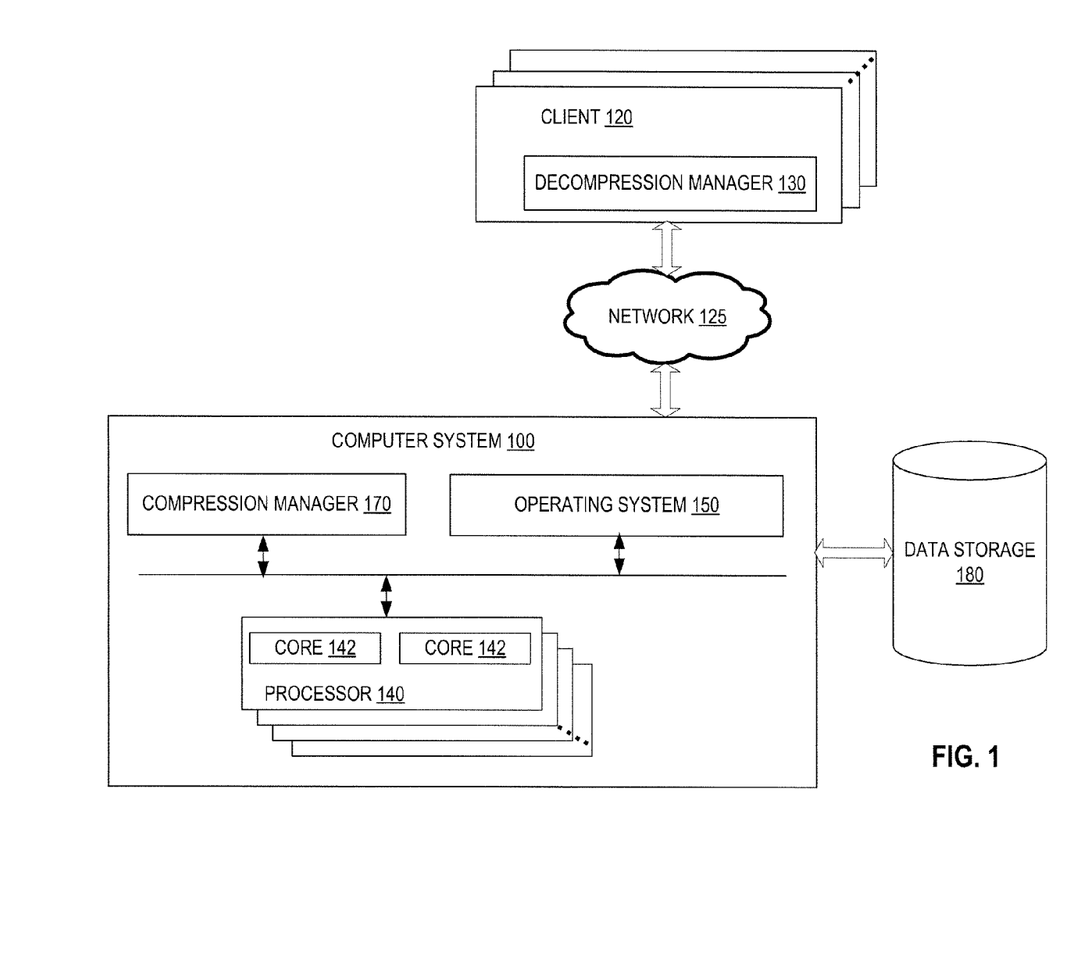
FIG. 1 is a block diagram illustrating one embodiment of a network environment in which a computer system may operate.

FIG. 1 illustrates a network architecture in which embodiments of the present invention may operate. The network architecture includes a computer system 100 coupled to one or more client machines ("clients") 120 over a network 125. The network 125 may be a private network (e.g., a local area network (LAN), a wide area network (WAN), intranet, etc.) or a public network (e.g., the Internet). The computer system 100 includes multiple processors 140, with each processor 140 including one or more processing cores ("cores") 142. The computer system 100 runs an operating system 150 for allocating system resources. The computer system 100 is also coupled to data storage 180. The data storage 180 includes one or more mass storage devices (e.g., disks), which form a storage pool shared by all of the processors 140 and cores 142 in the computer system 100.

In one embodiment, the computer system 100 may include one or more servers. The client 120 may be a computer (e.g., a server, a workstation, a personal computer (PC), a laptop, etc.), a mobile phone, a hand-held computing device, a game station, a personal digital assistant (PDA), etc. In one embodiment, the computer system 100 is hosted by a service provider that distributes software packages to the clients 120. Some of the packages may have one or more gigabytes. To store and transfer the packages efficiently, the computer system 100 may compress the software packages into compressed files that have fewer bits than the original data. In one embodiment, the computer system 100 may include a compression manager 170 to manage compression of the original data. One or more of the client 120 may include a decompression manager 130 to manage decompression of the data received from the computer system 100. In one embodiment, the data compression is based on a dictionary-based sequential compression algorithm, which can be executed in parallel to increase the compression speed. The data decompression may be parallel, sequential, or as selected by a user of the client 120. The choice of the data decompression scheme may be dependent on the hardware capability of the client 120 and the need of the user.

Figure 2:
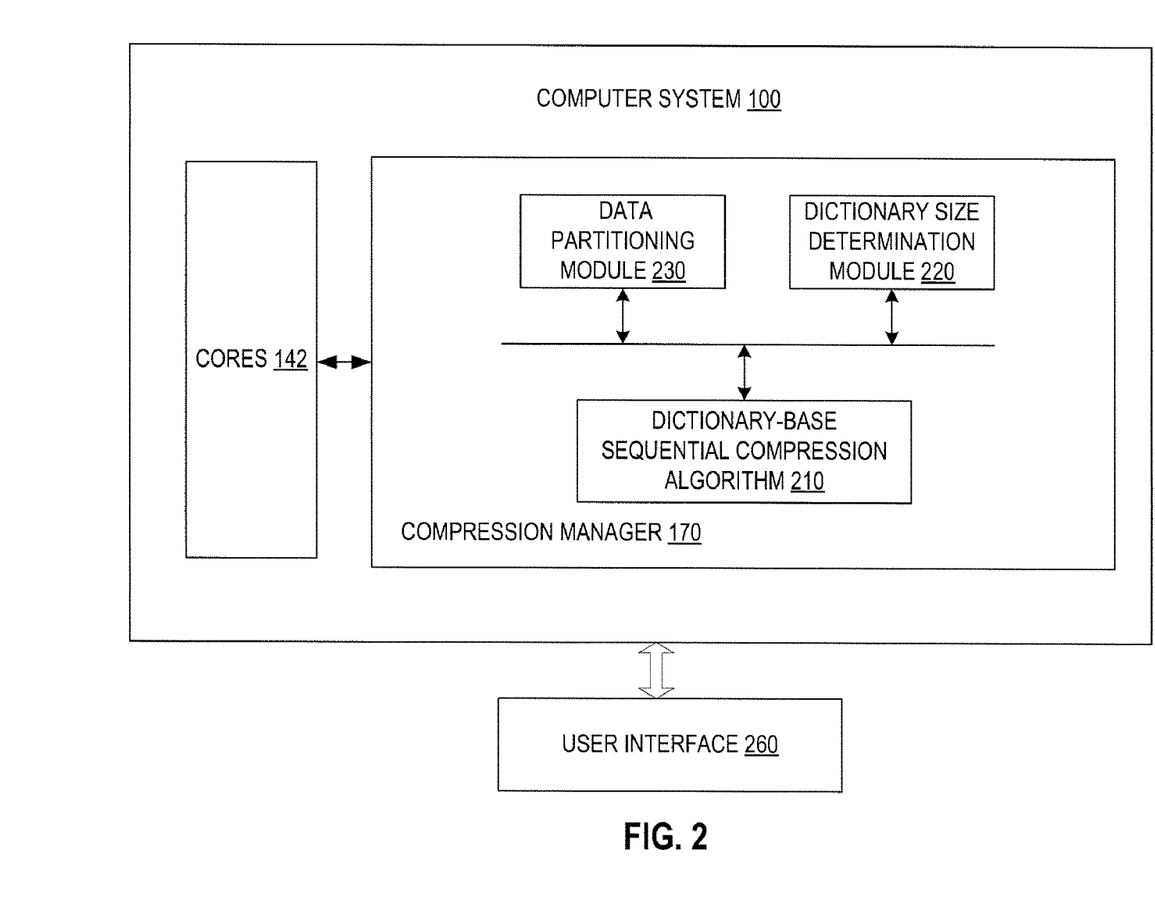
FIG. 2 is a block diagram illustrating one embodiment of a compression manager in the computer system of FIG. 1.

FIG. 2 illustrates a block diagram of an embodiment of the compression manager 170 in the computer system 100. The compression manager 170 includes memory to store a dictionary-based sequential compression algorithm 210 executable by the cores 142. In one embodiment, the dictionary-based sequential compression algorithm 210 is based on Lempel-Ziv compression algorithm or its variants, e.g., LZ77, LZ78, LZMA, etc. The compression manager 170 also includes a dictionary size determination module 220 for determining the size of the dictionary to be used in the compression process. In one embodiment, the dictionary size is proportional to a compression level selected by a user or a system administrator. For example, a user can select from a number of compression levels (e.g., from 1 to 9) provided by the computer system 100. The lower the compression level is, the smaller the dictionary size is to be used. A smaller dictionary size corresponds to a smaller input block size (e.g., the block size may be three times of the dictionary size), which means that the compression input can be split into a larger number of threads. In a system with a large number of cores, parallel execution of a large number of threads can significantly increase the compression speed.

However, a large dictionary typically provides better a compression result in terms of the compressed data size. A dictionary defines a sliding window that extends from the encoding position backwards in a compressed file. An encoder uses this sliding window to find a match between the data at the encoding position and the set of strings in the dictionary. With a large dictionary, it is more likely that the encoder finds a match in the dictionary and encodes data with a reference in the dictionary. Thus, the size of the dictionary may be determined by balancing the factors that include the number of threads to be executed in parallel and the compressed data size.

In one embodiment, each compression level provided by the computer system 100 for user selection is associated with a penalty in the compressed data size. The lowest compression level (e.g., 1), which corresponds to parallel execution with the smallest dictionary size, is associated with the largest penalty. There is also a penalty associated with compression executed in parallel, which is caused by a fact that a sliding window cannot reach data before the beginning of a data block and therefore a compression starts with an empty dictionary for each data block (when starting a compression of each data block, the sliding window is truncated and the dictionary is empty). However, even the largest penalty, caused by partitioning to blocks, incurs only a small increase in the compressed data size (e.g., 1%-3%) when compared with a single-threaded sequential execution if data blocks are sufficiently large. The comparison is made with the same compression level and therefore the same dictionary size, so that one can find out how much penalty is caused by splitting the input data into independent data blocks. Therefore, a system administrator can evaluate system requirements and constraints to determine a desired compression speed and compressed data output.

As an example, the following table shows dictionary sizes for particular compression levels (where the MiB unit stands for mebibytes, which is $2^{20}$ bytes):

| Compression Level | Dictionary Size (MiB) |
|---|---|
| 1 | 2 |
| 2 | 5 |
| 3 | 13 |
| 4 | 25 |
| 5 | 48 |
| 6 | 94 |
| 7 | 186 |
| 8 | 370 |
| 9 | 674 |

For example, the tests for parallel compression in comparison with single-threaded sequential compression were executed with a default compression level 6 (, with dictionary size of 94 Mbytes). It is understood that a different compression level may be used. In alternative embodiments, each compression level may correspond to a dictionary size different from the above table.

The compression manager 170 also includes a data partitioning module 230 to partition the input data into a number of data blocks. In one embodiment, the size of each data block is chosen to be greater than the dictionary size for improved compression performance (with respect to the compressed data size). In one embodiment, the size of each data block is set to be an integer multiple of the dictionary size (e.g., three times the dictionary size). In one embodiment, the size of the compressed data output may increase linearly when smaller data blocks per thread are used. This correlation of compressed data size and the size of the data blocks exist when there is sufficient entropy in data to be compressed (i.e., the data is not trivial, does not contain runs of the same letters, etc.). Nevertheless, the increase in the compressed data size is negligible.

After the dictionary size is determined and the data blocks are partitioned, the compression manager 170 sends (C×P) data blocks to the cores 142, where C is the number of cores 142 and P is the number of processors 140 that are available for performing data compression. The cores 142 then compress the (C×P) data blocks in parallel using the dictionary-based sequential compression algorithm 210.

In one embodiment, the computer system 100 is coupled to a user interface device 260 (e.g., a display that provides a user interface) to display compression information, such as the name of a file to be compressed and the selectable compression levels. The user interface device 260 also receives user inputs, such as a desired compression level.

With parallel execution of the dictionary-based sequential compression, the computer system 100 can speed up the compression time significantly. For example, the speed up can be as much as 65%, which means that the parallel compression takes only 35% of the time that the same input data is compressed in a single thread. The speed up can be obtained with a small penalty of increased final archive size by about 1%.

The parallel compression scheme described herein allows a user (e.g., a system administrator) to obtain a compression speed as fast as possible with a defined compression penalty. When a user defines a penalty (e.g., 3%) that he is willing to sacrifice by choosing a compression level, the parallel compression scheme may allow the compression to speed up by a factor close to 80%. The compression speed up increases almost linearly with the number of cores that perform the compression. The increase in compression speed is much greater than the negligible increase in the compressed output size caused by the parallel compression.

Figure 3:
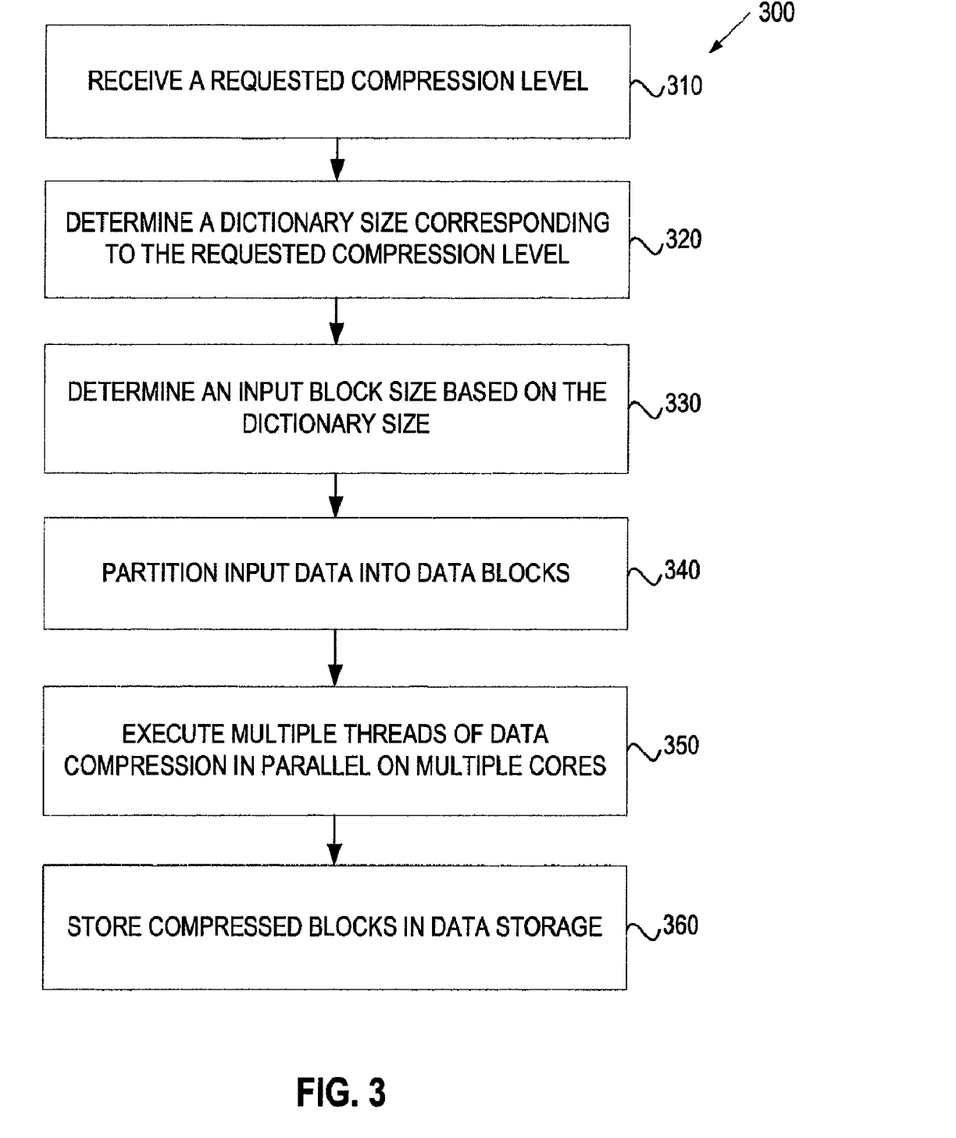
FIG. 3 is a flow diagram illustrating a method for parallel data compression, in accordance with one embodiment of the present invention.

FIG. 3 is a flow diagram illustrating one embodiment of a method 300 for parallel data compression. The method 300 may be performed by a computer system 600 of FIG. 6 that may comprise hardware (e.g., circuitry, dedicated logic, programmable logic, microcode, etc.), software (e.g., instructions run on a processing device), or a combination thereof. In one embodiment, the method 300 is performed by the computer system 100 of FIG. 1.

Referring to FIG. 3, in one embodiment, the method 300 begins when the computer system 100 receives a data compression request (e.g., from a system administrator via a user interface) that indicates a requested compression level (block 310). In response to the request, the compression manager 170 determines a dictionary size corresponding to the requested compression level (block 320). The association between each compression level and the corresponding dictionary size may be pre-determined (e.g., before compression runtime). Based on the dictionary size, the compression manager 170 determines an input block size (block 330). To optimize the compression, the input block size is set to be greater than the dictionary size. In one embodiment, the input block size is set to be an integer multiple of the dictionary size (e.g., three times the dictionary size).

Upon receiving the input data (e.g., a document to be compressed), the compression manager 170 partitions the input data into a number of data blocks, with each data block having the block size determined at block 330 (block 340). The compression manager 170 sends the data blocks to the available cores in the computer system 100 for parallel execution, using the dictionary-based sequential compression algorithm (block 350). In one embodiment, the number of the available cores is equal to (C×P), where C is the number of cores in each processor and P is the number of processors. The cores execute multiple threads of data compression in parallel, with each core executing one thread for compressing one or more data blocks. The compressed data can be stored in data storage as a compressed archive (block 360). In one embodiment, the compressed archive can be transferred to a recipient (e.g., the client 120) upon request. In an alternative embodiment, the data compression may be performed in real time upon the request of the client 120.

If there is more input data to be compressed, the compression manager 170 can further partition the remaining input data into data blocks for parallel execution. The method 300 terminates when all of the input data is compressed.

In one embodiment, the computer system 100 transfers the compressed data to the client 120 upon request of the client 120. After receiving the compressed data, the client 120 decompresses the data to obtain the original data. Embodiments of data decompression at the client 120 are described with reference to FIGS. 4 and 5.

Figure 4:
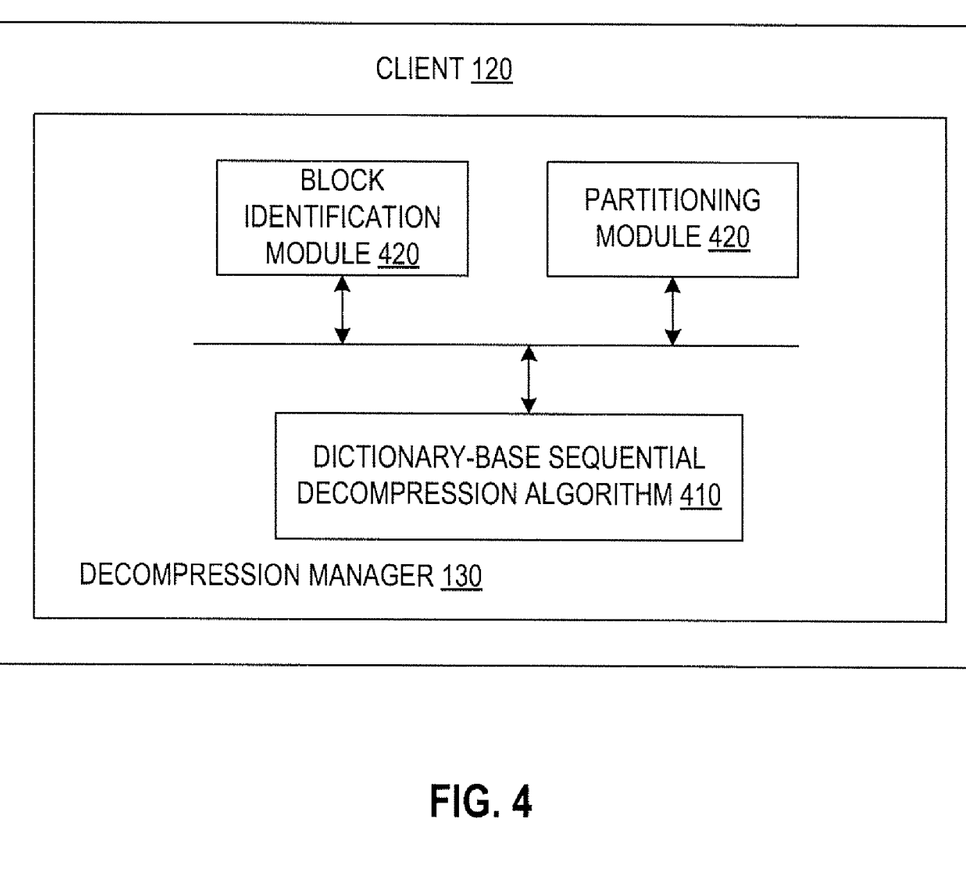
FIG. 4 is a block diagram illustrating one embodiment of a decompression manager.

FIG. 4 illustrates a block diagram of an embodiment of the decompression manager 130 of the client 120. The decompression manager 130 includes memory to store a dictionary-based sequential decompression algorithm 410 executable by the client 120. The dictionary-based sequential decompression algorithm 410 decompresses the data that has been compressed by the computer system 100. In one embodiment, the dictionary-based sequential decompression algorithm 410 is based on Lempel-Ziv compression algorithm or its variants, e.g., LZ77, LZ78, LZMA, etc. The client 120 may be informed of the dictionary to be used by the computer system 100 or by a user of the client 120.

The decompression manager 130 may decompress the data from the computer system 100 sequentially or in parallel on multiple cores. The determination of whether to decompress the data sequentially or in parallel may be made by the user of the client 120, or automatically made by the client 120 according to the available processors and cores in the client 120. The decompression manager 130 includes a partition module 420 that uses the block size determined by the computer system 100 to partition the received data streams into a sequence of data blocks. The client 120 may be informed of the block size by the computer system 100 or by a user of the client 120.

In one embodiment, the client 120 may decompress the data selectively. For example, the data of interest to the user may be contained in one or more of the data blocks. The client 120 may identify the location of the data blocks in the received data stream, and decompress only these data blocks. The identified data blocks may be decompressed sequentially or in parallel. In one embodiment, the decompression manager 130 may include a block identification module 420 that identifies the location of the one or more blocks of interest. The identification of the data blocks may be directed by the user, or automatically by the client 120 based on the data that is currently needed. The capability of selective decompression can significantly reduce the computation load of the client 120.

Figure 5:
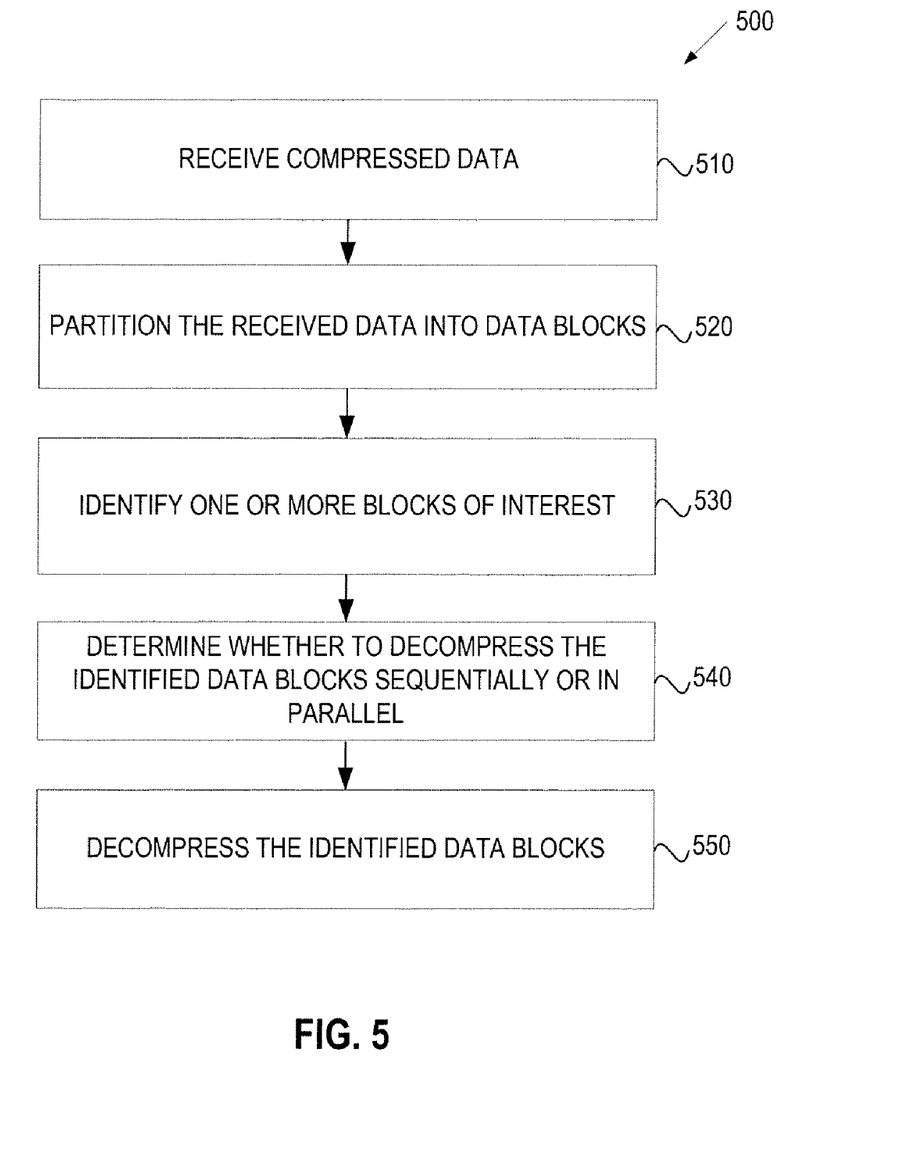
FIG. 5 is a flow diagram illustrating a method for data decompression, in accordance with one embodiment of the present invention.

FIG. 5 is a flow diagram illustrating one embodiment of a method 500 for data decompression. The method 500 may be performed by computer system 600 of FIG. 6 that may comprise hardware (e.g., circuitry, dedicated logic, programmable logic, microcode, etc.), software (e.g., instructions run on a processing device), or a combination thereof. In one embodiment, the method 500 is performed by the client 120 of FIG. 1.

Referring to FIG. 5, in one embodiment, the method 500 begins when the client 120 receives an input data stream that contains the data to be decompressed (block 510). The decompression manager 130 of the client 120 partitions the received data into data blocks, using the block size determined by the computer system 100 during the compression process (block 520). The decompression manager 130 then identifies one or more data blocks to be decompressed automatically or as directed by the user (block 530). The client 120 then determines whether to decompress the identified data blocks sequentially or in parallel, based on the number of cores that are available in the client 120 (block 540). The client 120 then decompresses the identified data blocks using a dictionary-based sequential decompression algorithm, which is the counterpart of the compression algorithm used by the computer system 100 (block 550). The decompressed data can be installed on the client 120 to perform updates or other operations.

Figure 6:
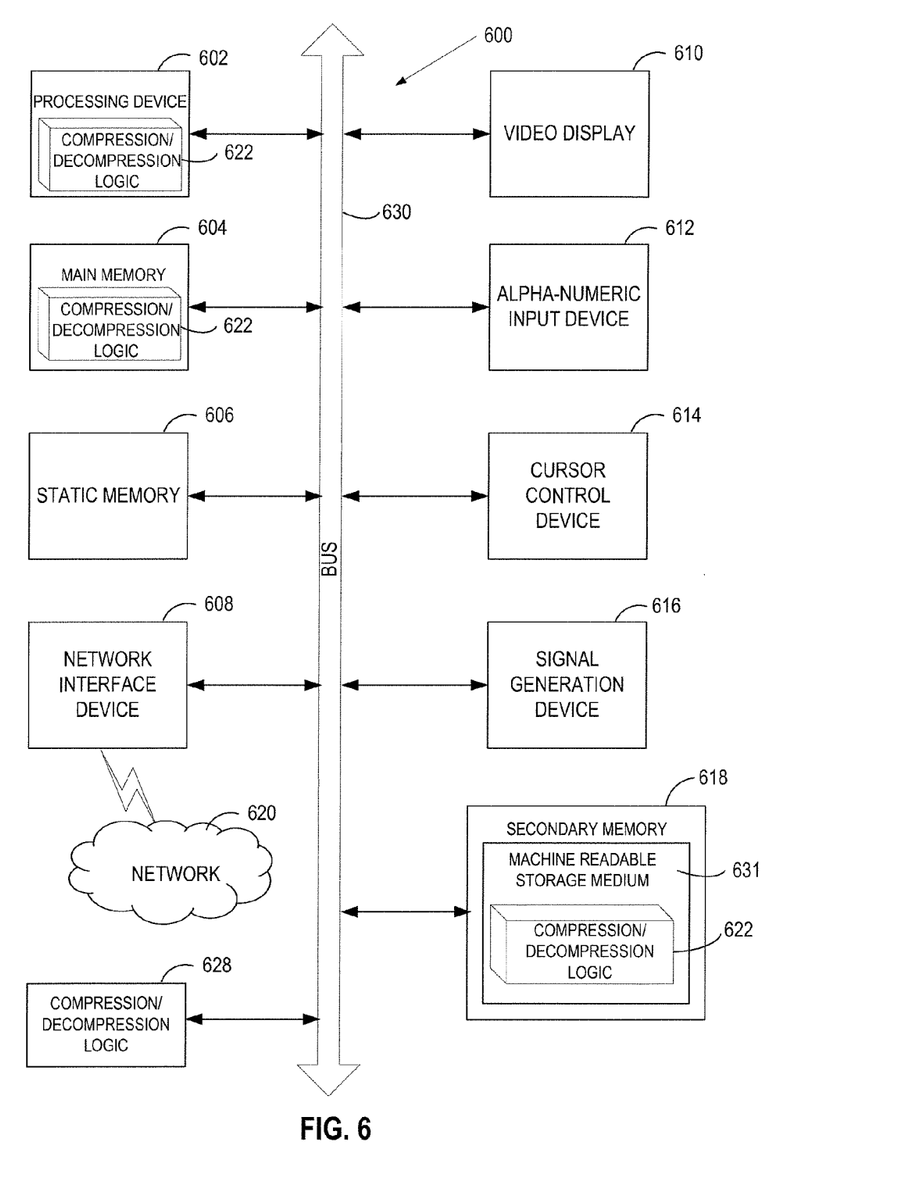
FIG. 6 illustrates a diagrammatic representation of a machine in the exemplary form of a computer system.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

The processing device 602 represents one or more general-purpose processing devices such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processing device 602 may also be one or more special-purpose processing devices such as an application specific integrated circuit (ASIC), a field programmable gate array (FPGA), a digital signal processor (DSP), network processor, or the like. The processing device 602 is configured to execute compression/decompression logic 622 for performing the operations and steps discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-readable storage medium (or more specifically a computer-readable storage medium) 631 on which is stored one or more sets of instructions (e.g., compression/decompression logic 622) embodying any one or more of the methodologies or functions described herein (e.g., the compression manager 170 or the decompression manager 130 of FIG. 1). The compression/decompression logic 622 may also reside, completely or at least partially, within the main memory 604 and/or within the processing device 602 during execution thereof by the computer system 600; the main memory 604 and the processing device 602 also constituting machine-readable storage media. The compression/decompression logic 622 may further be transmitted or received over a network 620 via the network interface device 608.

The machine-readable storage medium 631 may also be used to store the compression/decompression logic 622 persistently. While the machine-readable storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine that cause the machine to perform any one or more of the methodologies of the present invention. The term "machine-readable storage medium" shall accordingly be taken to include, but not be limited to, solid-state memories, and optical and magnetic media.

The computer system 600 may additionally include a compression/decompression module 628 for implementing the functionalities of the compression manager 170 or the decompression manager 130 of FIG. 1. The module 628, components and other features described herein (for example in relation to FIG. 1) can be implemented as discrete hardware components or integrated in the functionality of hardware components such as ASICS, FPGAs, DSPs or similar devices. In addition, the module 628 can be implemented as firmware or functional circuitry within hardware devices. Further, the module 628 can be implemented in any combination of hardware devices and software components.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "executing", "determining", "compressing", "decompressing", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relates to an apparatus for performing the operations herein. This apparatus may be specially constructed for the required purposes, or it may comprise a general purpose computer system selectively programmed by a computer program stored in the computer system. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method, implemented by a computer system programmed to perform the following, comprising:
   determining, by the computer system, a dictionary size for data compression based on a received compression level;
   determining, by the computer system, a block size greater than the dictionary size for partitioning input data; and executing multiple threads in parallel using multiple cores of the computer system, each thread compressing one block of the input data according to a dictionary-based sequential compression scheme.

2. The method of claim 1, wherein the dictionary-based sequential compression scheme is based on a Lempel-Ziv compression algorithm or a variant thereof.

3. The method of claim 1, wherein the block size is an integer multiple of the dictionary size.

4. The method of claim 1, further comprising:
receiving an input from a user that indicates the compression level.

5. The method of claim 1, further comprising:
providing a plurality of compression levels for user selection, each compression level associated with a penalty of increased compressed data size.

6. A system comprising:
data storage to store input data; and
a computer system coupled to the data storage, the computer system comprising:
a compression manager to determine a dictionary size based on a received compression level and to determine a block size that is greater than the dictionary size for partitioning input data; and
a plurality of cores to execute multiple threads in parallel, each thread to compress one block of the input data according to a dictionary-based sequential compression scheme to generate the compressed data.

7. The system of claim 6, wherein the dictionary-based sequential compression scheme is based on a Lempel-Ziv compression algorithm or a variant thereof.

8. The system of claim 6, wherein the block size is an integer multiple of the dictionary size.

9. The system of claim 6, further comprising:
a user interface to receive, from a user, the compression level, based on which the dictionary size is determined.

10. The system of claim 6, wherein the computer system provides a plurality of compression levels for user selection, each compression level associated with a penalty of increased compressed data size.

11. A non-transitory computer readable storage medium including instructions that, when executed by a processing system, cause the processing system to perform a method comprising:
determining a dictionary size for data compression based on a received compression level;
determining a block size greater than the dictionary size for partitioning input data; and
executing multiple threads in parallel using multiple cores of a computer system, each thread compressing one block of the input data according to a dictionary-based sequential compression scheme.

12. The computer readable storage medium of claim 11, wherein the dictionary-based sequential compression scheme is based on a Lempel-Ziv compression algorithm or a variant thereof.

13. The computer readable storage medium of claim 11, wherein the block size is an integer multiple of the dictionary size.

14. The computer readable storage medium of claim 11, wherein the method further comprises:
receiving an input from a user that indicates the compression level.

15. The computer readable storage medium of claim 11, wherein the method further comprises:
providing a plurality of compression levels for user selection, each compression level associated with a penalty of increased compressed data size.

16. A method, implemented by a client machine programmed to perform the following, the method comprising:
partitioning, by the client machine, compressed data into a plurality of data blocks;
determining whether to decompress the plurality of data blocks sequentially or in parallel; and
decompressing the data blocks accordingly by the client machine using a dictionary-based sequential decompression scheme.

17. The method of claim 16, wherein determining whether to decompress the data blocks of interest sequentially or in parallel is based on the number of available cores in the client machine.

18. A non-transitory computer readable storage medium including instructions that, when executed by a processing system, cause the processing system to perform a method comprising:
partitioning compressed data into a plurality of data blocks;
determining whether to decompress the data blocks of interest sequentially or in parallel;
and decompressing the data blocks accordingly by the client machine using a dictionary-based sequential decompression scheme.

19. The computer readable storage medium of claim 18, wherein determining whether to decompress the data blocks of interest sequentially or in parallel is based on the number of available cores in the client machine.

* * * * *